United States Patent [19]
Welch et al.

[11] Patent Number: 5,319,524
[45] Date of Patent: Jun. 7, 1994

[54] CARD CAGE SYSTEM

[75] Inventors: Glenn S. Welch, Lynnfield; Stephen A. Fidrych, Boxborough; Michael Romm, Brighton, all of Mass.

[73] Assignee: Digital Equipment Corporation, Maynard, Mass.

[21] Appl. No.: 43,290

[22] Filed: Apr. 6, 1993

Related U.S. Application Data

[62] Division of Ser. No. 93,970, Sep. 8, 1987, Pat. No. 5,218,519.

[51] Int. Cl.⁵ .............................................. H05K 5/00
[52] U.S. Cl. ..................................... 361/754; 361/798; 361/801; 439/157; 439/159; 439/160
[58] Field of Search .................. 211/41; 361/394, 397, 361/399, 412, 413, 415, 420, 732, 740, 747, 754, 755, 759, 798; 403/326, 328, 329, 330, 335, 336, 338; 439/152, 153, 155, 157, 159, 160, 476, 483, 372; 292/57, 85; 206/334, 509; 220/225, 22.5, 22.2, 22.4

[56] References Cited

U.S. PATENT DOCUMENTS

| | | | |
|---|---|---|---|
| 3,150,906 | 9/1964 | Chambon et al. | 439/157 |
| 3,177,404 | 4/1965 | Patmore | 361/394 |
| 3,245,546 | 4/1966 | Stühler | 361/415 |
| 3,335,386 | 8/1967 | Upton | 439/157 |
| 3,582,865 | 6/1971 | Franck | 361/413 |
| 3,939,382 | 2/1976 | Lacan et al. | 361/415 |
| 4,008,942 | 2/1977 | Grossi | 361/397 |
| 4,198,024 | 4/1980 | Cavanna | 361/413 |
| 4,232,356 | 11/1980 | Saunders et al. | 361/415 |
| 4,334,261 | 6/1982 | Gonzales | 361/415 |
| 4,388,671 | 6/1983 | Hall et al. | 361/399 |
| 4,429,937 | 2/1984 | Stockmaster | 361/415 |
| 4,434,537 | 3/1984 | Bean et al. | 361/798 |
| 4,444,318 | 4/1984 | Alexander | 361/412 |
| 4,471,408 | 9/1984 | Martinez | 361/392 |
| 4,533,977 | 8/1985 | Koppensteiner et al. | 361/415 |
| 4,573,104 | 2/1986 | Kamada | 361/399 |
| 4,580,192 | 4/1986 | Beun | 361/399 |
| 4,603,375 | 7/1986 | Miller et al. | 361/754 |
| 4,679,121 | 7/1987 | Schomers et al. | 361/393 |
| 4,690,286 | 9/1987 | Horne et al. | 361/415 |
| 4,694,380 | 9/1987 | Mallory et al. | 361/415 |
| 4,785,533 | 11/1988 | Seino et al. | 361/412 |
| 4,821,146 | 4/1989 | Behrens et al. | 361/798 |
| 5,162,980 | 11/1992 | Morgan et al. | 361/798 |

FOREIGN PATENT DOCUMENTS 2736545 2/1979 Fed. Rep. of Germany ...... 361/399

OTHER PUBLICATIONS

Mollen et al., "High-Density Cable Connector System", *IBM Tech. Disc. Bull.*, vol. 20, #11A. Apr. 1978, pp. 4311 and 4312 relied on.

Franck et al., "Microcircuit Module and Conector", *IBM Tech. Disc. Bull.*, vol. 13, #7, Dec. 1970, pp. 1786 relied on.

*Primary Examiner*—Lincoln Donovan
*Assistant Examiner*—D. Sparks
*Attorney, Agent, or Firm*—Richard J. Paciulan; Denis G. Maloney

[57] ABSTRACT

A card cage formed of mating, identical halves provides parallel slots for circuit boards carrying snap-on retainer clips with integral pawl-like clasps which lock over ridges on the exterior of the card cage. The clip is released from the cage by squeezing the clasps with one hand before withdrawing the circuit board. Slotted side brackets capture mating ribs on the card cage halves to assemble and mount the card cge to a wiring clost panel.

11 Claims, 5 Drawing Sheets

CARD CAGE SYSTEM

This is a divisional of copending application Ser. No. 07/093,970, filed Sep. 8, 1987 now U.S. Pat. No. 5,218,519.

BACKGROUND OF THE INVENTION

The invention relates to card cages for housing of electronic circuit boards.

With the advent of the circuit board, now ubiquitous in all forms of electronic equipment, chassis and cabinetry for electronic circuitry changed markedly. In the architecture of circuit board housing, several competing functional interests must be resolved in order for form to truly follow function. Geometrical or space constraints, electrical requirements and so called human factors do not always mesh. The assembly of iterative circuitry represents one of the harder schemes to design well, i.e., creatively with enhanced functionality. The goal of housing numerous similar or identical circuit boards can give rise merely to mundane solutions which offer nothing more than a common roof.

Data communications equipment in particular offers a challenging number and variety of interconnections to organize and manage from the mechanical standpoint. Complex junction boxes called wiring closets with racks of connectors handle the tangle of interconnections between related circuitry. Iterative interface circuitry may exist for the purpose of routing or multiplexing or may serve solely to convert or adapt signals on one multi-cable system to another format compatible with a different multi-cable system. An example of the latter adapter system is a wiring closet interfacing a set of coaxial cables with a set of unshielded twisted pair cables. Interconnecting these dissimilar types of cables without affecting data throughput requires careful impedance matching typically carried out by dedicated circuitry mounted 011 a printed circuit board with cable connectors. The numbers of cables involved in a given wiring closet depend, for example, on the size and type of local area network. The overall architecture of the wiring closet should be mechanically sound and easy to install, but should not lose sight of the need for versatility to accommodate networks of various sizes and to allow for easy expansion and change within a given network. Facilitating installation, serviceability and expandability with simple procedures and low cost materials, while maintaining a reasonably high density circuit board enclosure, should be major objectives of the mechanial design.

SUMMARY OF THE INVENTION

One general feature of the invention provides a card cage with parallel slots for circuit boards carrying retainer clips having edge fasteners for detachably connecting the clip to the circuit board and at least one cage fastener for releasably connecting the clip to the card cage to hold the circuit board in place. Preferred embodiments of the invention include detents, preferably ridges, formed on the top and bottom of the card cage which are engaged by a pair of hinged clasps on opposite ends of the retainer clip. The clasps are manually operable by a single hand simultaneously to release the clip from the card cage.

In another aspect of the invention, the circuit board housing comprises a card cage made of mating halves having opposed grooves forming parallel slots for respective circuit boards and a fastener for holding the halves together. Preferred embodiments of this aspect of the invention include mating projections along the separation line of both halves, preferably on opposite sides of the card cage, forming ribs which are captured by mating recesses in side brackets which can be used to mount the card cage to a panel. In the preferred arrangement, a plurality of identical card cages with identical mating halves are fixed to a given panel with respective sets of slotted brackets.

A further aspect of the invention is the design of the retainer clip itself. The clip has an elongated base with an edge fastener for detachably gripping the edge of the circuit board and at least one clasp for releasably connecting the clip with the attached board to the card cage to hold the board in place within the cage. Preferred embodiments of this aspect of the invention include the following features. The base may be an elongated generally rectangular plate with clasps extending at right angles in the same direction from either end of the base plate, the base plate having a region of reduced thickness near the junction with each clasp forming a resilient flexure hinge. Preferably the clasp is in the form of a clasp plate attached at its midpoint to the hinge, with one end of the clasp plate having a pawl and the other end forming a finger grip. To prevent overstressing of the hinges, the plate has an integral stop which is in the form of a vane rising perpendicularly from the base next to the hinge spaced from and perpendicular to the clasp plate. The edge fastener may include a plurality of spaced tabs at least two of which slip over opposite sides of the circuit board with projections which fit into recesses formed in the circuit board itself.

A final aspect of the invention is the design of a circuit board adapted to receive a retainer clip of the foregoing description. The board should have a series of recesses, preferably holes, in opposite sides along one edge for detachably receiving the bosses. Ideally, the board includes a series of electrically unconnected through holes aligned along opposite edges of the board so that the board can be reversed.

Manufacturing clam shell-type card cages with mating halves providing a small number of slots, for example, eight, offers a building block, modular-type system with flexibility to accommodate networks of various sizes, changing configurations and expanding needs. The retainer clips, preferably integral plastic moldings, snap on and off circuit boards with ease and clip on and off the card cages without any tools. The card slides in and locks in the cage automatically and is removed by a single motion with a single hand. This allows boards to be exchanged, relocated or repaired and replaced within a complex wiring closet in the simplest manner. Once attached, the retainer clips tend to further clamp the halves of the card cage together enhancing the structural integrity of the card cage assembly.

Other features and advantages of the invention will be apparent from the following description of the preferred embodiments, and from the claims.

DESCRIPTION OF THE PREFERRED EMBODIMENTS

The drawings are briefly described as follows.

Figure 2:
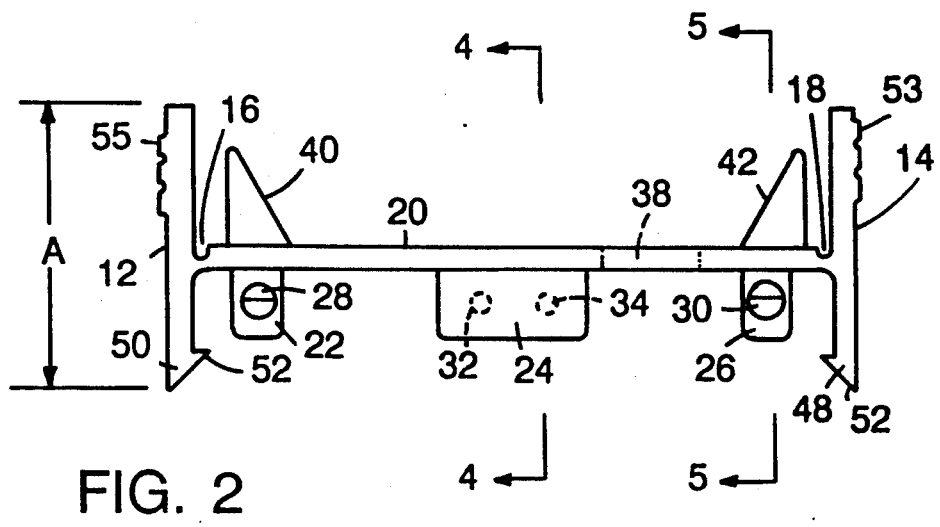
FIGS. 2 and 3 are a side view and plan view respectively of the retainer clip of FIG. 1.
Figure 4:
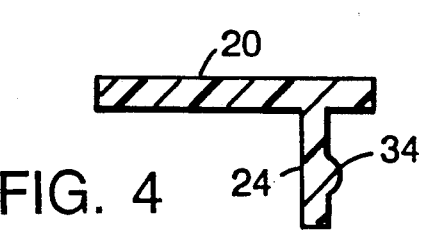
Figure 5:
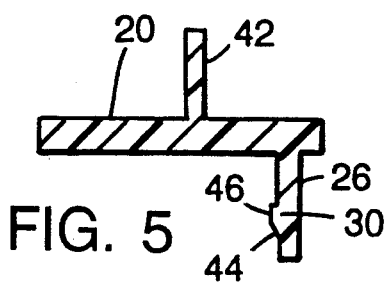

FIGS. 4 and 5 are sectional views taken along lines 4—4 and 5—5 respectively, in FIG. 2.

Figure 6:
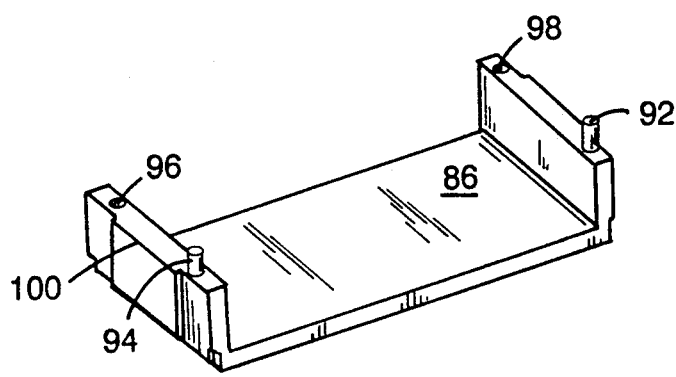

FIG. 6 is a perspective view of one half of a card cage according to the invention.

Figure 1:
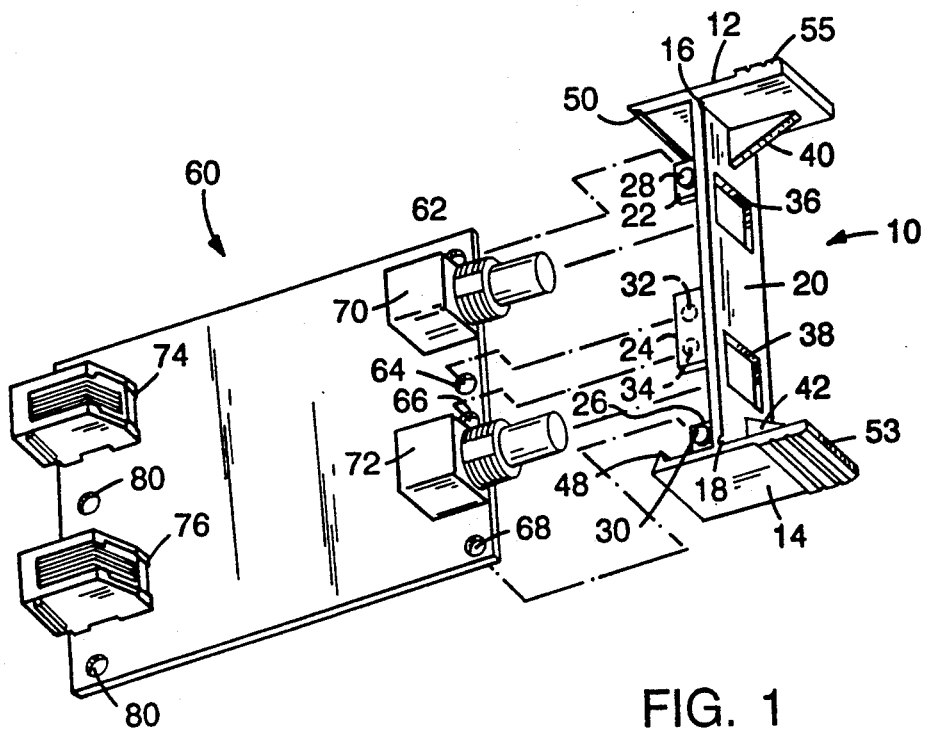
FIG. 1 is a perspective view showing connection of a retainer clip with a circuit board according to the invention.
Figure 7:
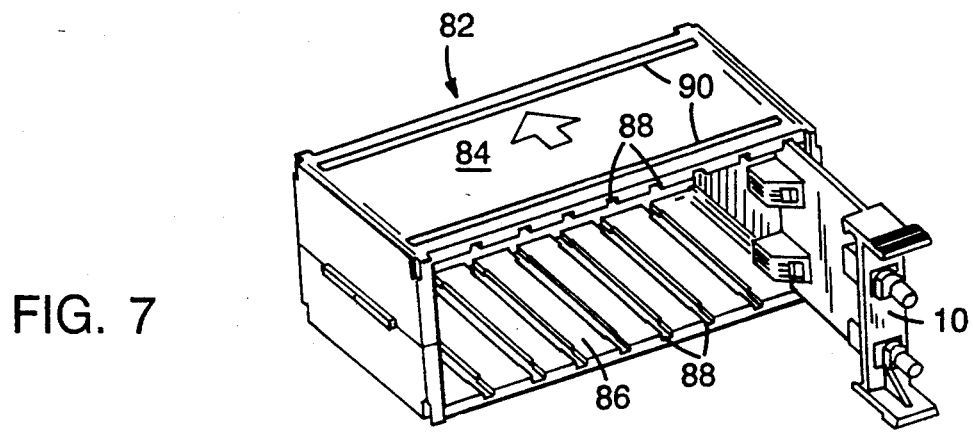

FIG. 7 is a perspective view of a circuit board with the retainer clip of FIG. 1 being inserted into a card cage assembled from the mating halves of FIG. 6.

Figure 8:
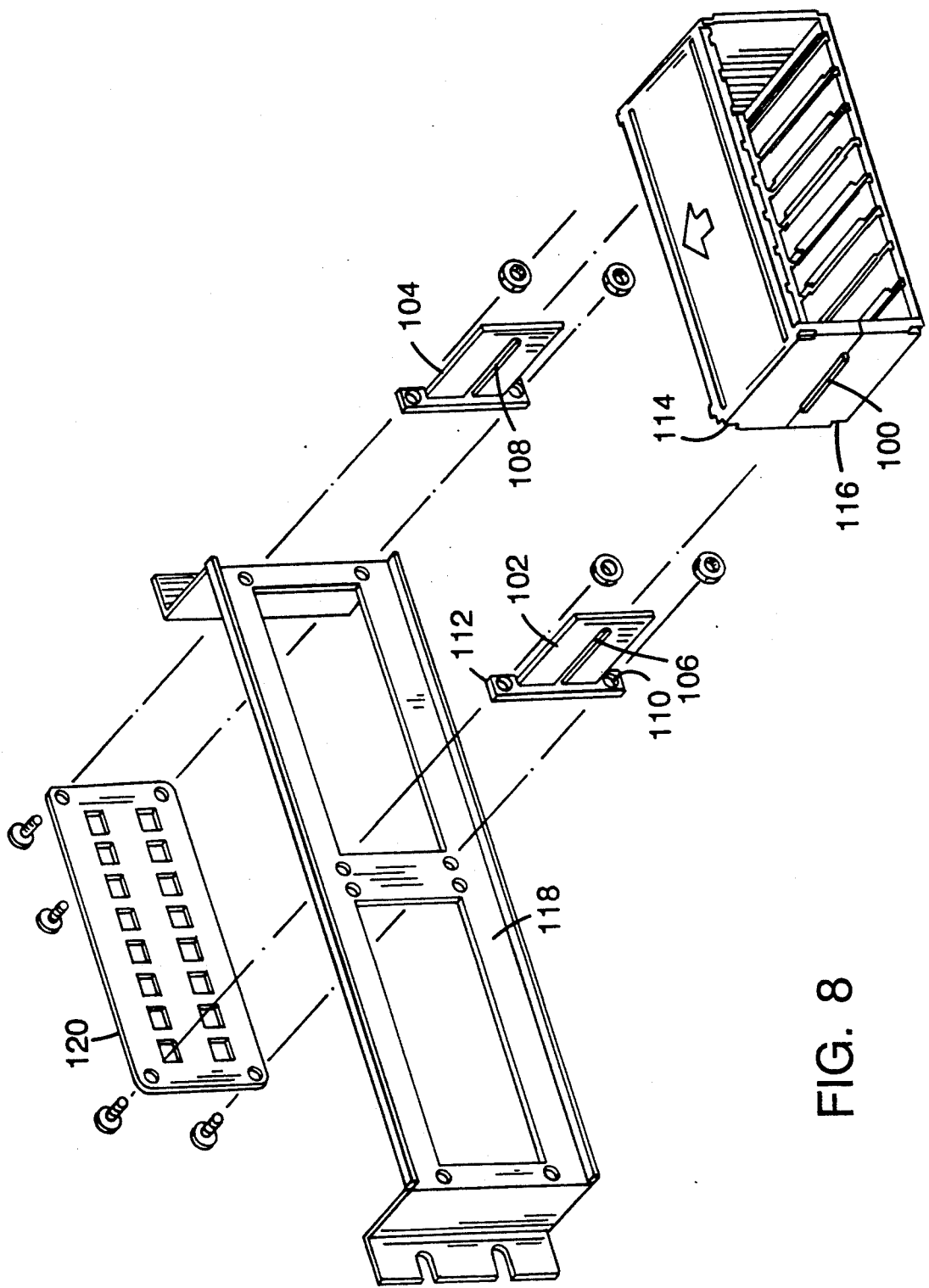
Figure 9:
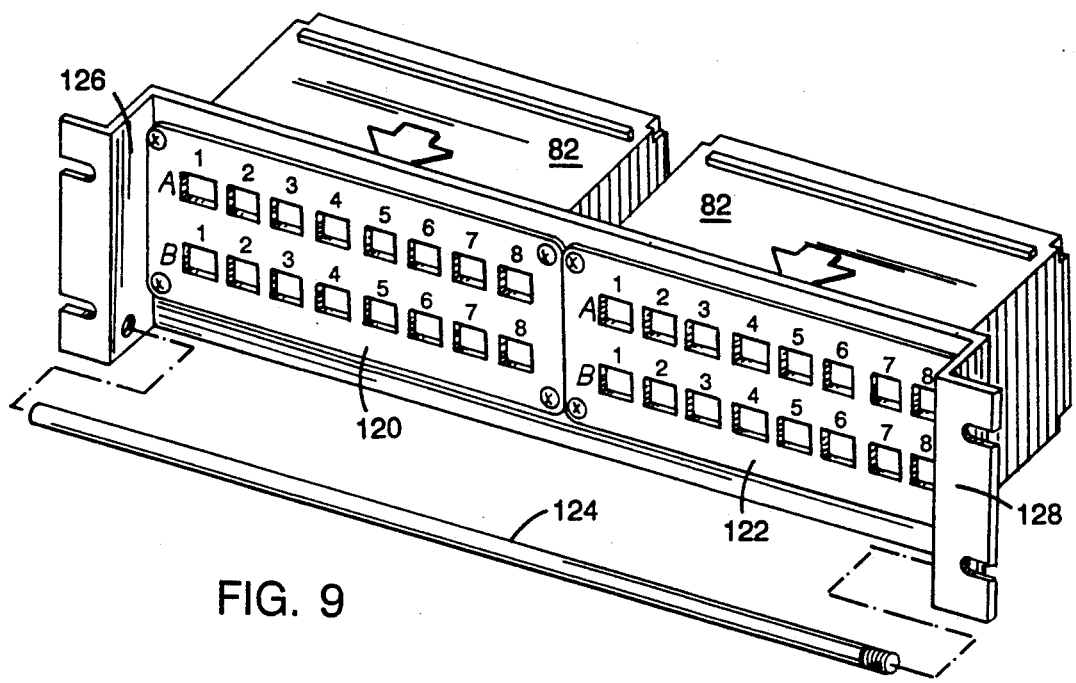
Figure 10:
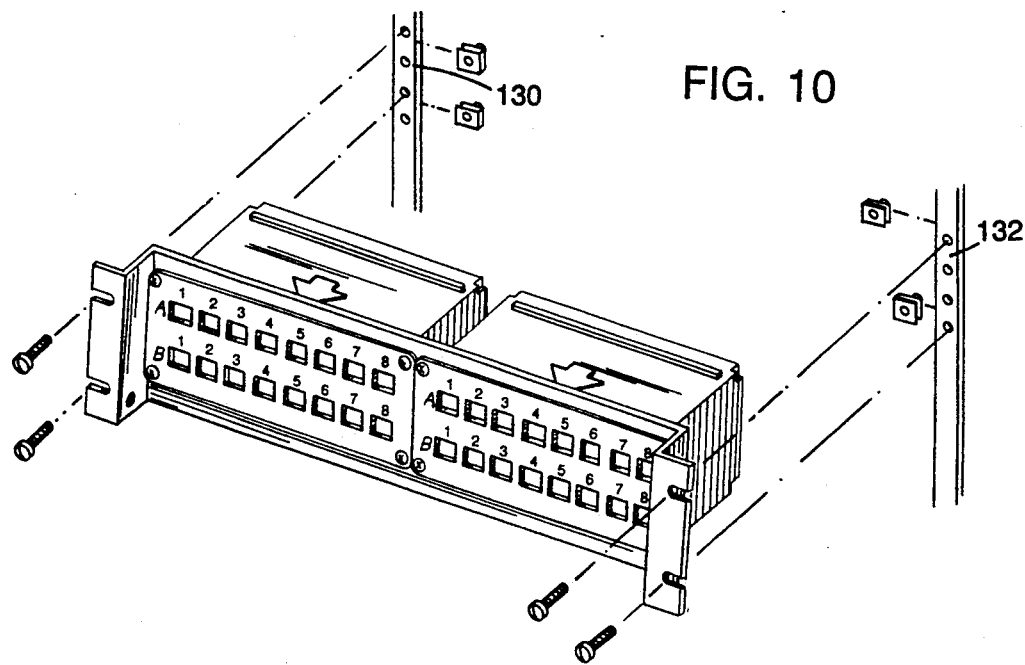
Figure 11:
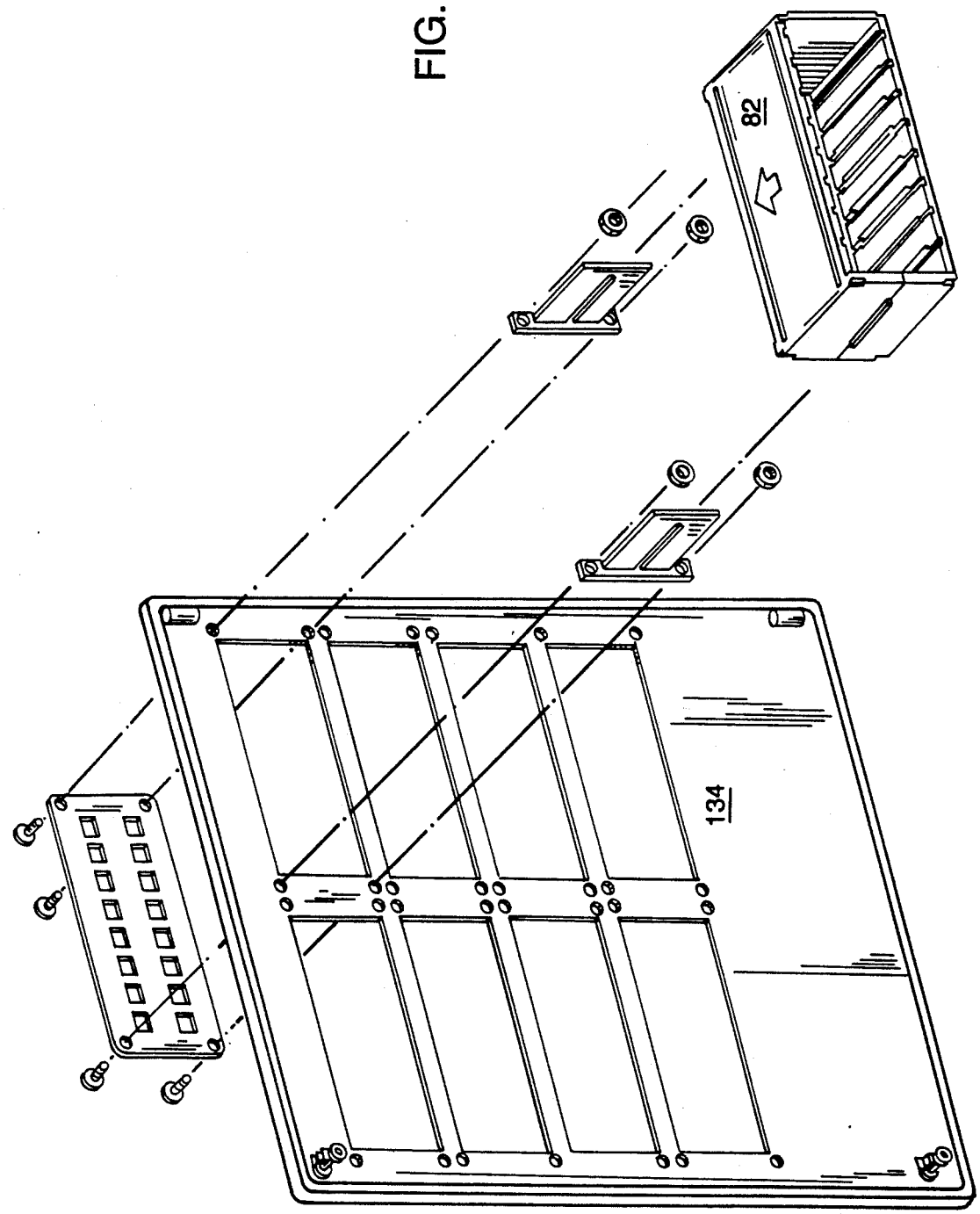

FIGS. 8, 9, and 10 are an exploded perspective view showing assembly of the card cage of FIG. 7 with a dual card cage panel for a wiring closet, the card cage connected to the dual panel, and an exploded perspective view showing connection of the dual panel with a wiring closet, respectively;

FIG. 11 is an exploded perspective view showing connection of the card cage of FIG. 7 with an eight cage panel.

Structure

Referring to FIGS. 1-5, I-shaped board retainer clip 10, formed by an integral plastic molding has two clasps 12 and 14 connected by integral, resilient flexure hinges 16, 18, to an elongated base 20. Hinges 16, 18 are formed by reduced thickness of the base 20 where it joins clasps 12, 14. Base 20 is provided with three flat, parallel, depending tabs 22, 24 and 26, disposed perpendicularly to base 20, having raised bosses 28, 30, 32 and 34. Also provided are two windows 36 and 38 having a size of 13×16 mm (width×depth), for example, suitable for accommodating connectors 70 and 72 on a stand-alone circuit board 60. Triangularly-shaped vane-like stop ribs 40 and 42 are spaced from clasps 12 and 14 by a distance equal to the width of hinges 16 and 18, 2 Mm. Base 20 has a depth of 2 mm, while grooves 18 and 20 have a depth of 1 mm, for example.

Bosses 28 and 30 on the outer tabs are cylindrically-shaped having a beveled leading edge 44 and a level top 46; bump-like bosses 32, 34 on the under surface of tab 24, have a generally semi-spherical shape. One end of each clamp 12, 14 has a hook-like panel 48, 50, with a bevelled edge 52. At the other ends of clamps 12, 14 are finger grip pads 53, 55.

Figure 3:
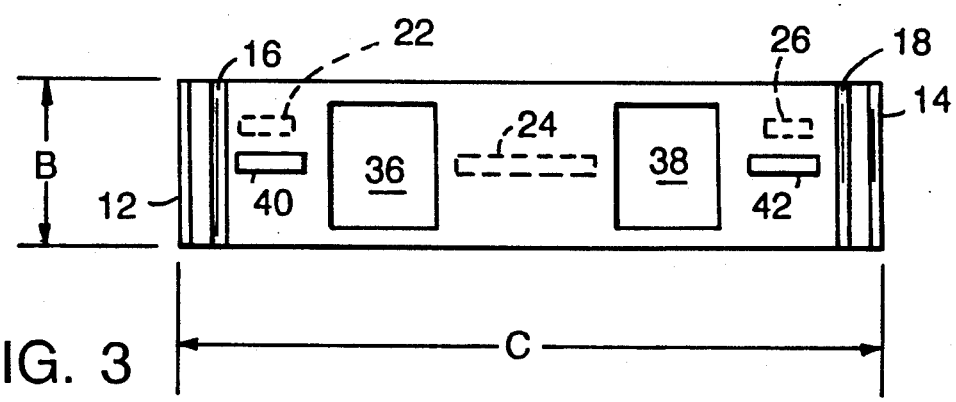

In one embodiment, by way of illustration, the height A of clasps 12 and 14 is 3.8 cm, their width B is 2.2 cm and the overall length C of clip 10 is 9.6 cm as shown in FIGS. 2 and 3.

Circuit board 60 is provided with four apertures on each end. Those apertures on the right side of the board as viewed in FIG. 1 being labelled 62, 64, 66 and 68. These apertures are positioned suitably for snap connection with each of bosses 28, 32, 34 and 30 respectively, as shown in FIG. 1 by dashed lines. Also provided are electrical twisted pair cable connectors 70, 72 at one end of board 60, and Thinwire* Ethernet* connectors 74, 76 at the other end. Electronic circuitry (not shown) on board 60 electrically connects these two sets of connectors, to match the 50 ohm impedance of Ethernet cable to the impedance of a twisted pair cable. Identical apertures at the other end of board 60, (only 78 and 80 being visible in FIG. 1) are positioned for connection with retainer clip 10 in a manner similar to that shown on the right side of FIG. 1. Thus, retainer clip 10 may be attached to either end of circuit board 60.

Referring to FIGS. 6 and 7, an open rectangular box-shaped card cage 82 is constructed from two identical mating halves 84 and 86, preferably in the form of plastic moldings, having opposed elongated grooves 88, which define slots to receive board 60, running along their width. Grooves 88 run to both edges of the card cage, and have a width of 2 mm, for example. Thus circuit board 60, having a width of 1.5 mm, for example, can readily slide within the grooves, as shown in FIG. 7. Grooves 88 are spaced apart to allow room for circuitry and connectors on module 60 within the card cage and the retainer clip width B. Also provided on card cage 82 is a longitudinal raised ridge 90 near each open end of each piece 84, 86 of the card cage, on the upper and lower outer surfaces respectively. Ridge 90 has a height of 1 mm. Also provided are two pins 92, 94 for connection with corresponding apertures 96, 98 in each piece of card cage 82; and a rib 100 on both sides of each piece 84, 86, having a depth of 3 mm. Ribs 100 on opposing card cage halves 84, 86 mate to form a single rib.

Use

Retainer clip 10 is connected to a circuit board 60 as shown in FIG. 1. The interleaved tabs 22, 24 and 26 are placed over the edge of the board 60 and bosses 28, 30, 32, and 34 are pushed toward apertures 62, 64, 66, and 68 until they snap into place. Card cage 82 is assembled by placing each half 84, 86 together so that pins 92, 94 are positioned within apertures 96, 98. Board 60 is readily inserted into card cage 82, as shown in FIG. 7 by sliding it into a slot defined by grooves 88. As the board slides home, the bevelled edges 52 on the pawl ends of 50 and 52 of the clasps ride up and over the front edges of the card cage and finally up and over the ridges 90 locking the clip in place. For insertion, it is recommended that pressure be applied at the middle of the base 20. The clasps automatically engage the cage without manipulation.

Board 60 is removed by squeezing grip pads 53, 55 as described above to release pawls 48, 50 from ridge 90, and thus allow clip 10 to be pulled from card cage 82, along with board 60.

To remove clip 10, for reuse for example, the clip is disconnected from module 60 by reversing the above connection procedure, as shown by dashed lines in FIG. 1.

Clip 10 is sized so that connection and disconnection with a card cage is readily performed using a thumb on one clasp and middle and fore finger of the same hand on the other clasp.

FIGS. 8-10 relate to apparatus for installation of card cage 82 within a wiring closet.

Referring to FIG. 8, card cage 82 is connected to two steel side brackets 102, 104 having elongated slots 106, 108 sized to accept and capture the two mating ribs 100. Mounting flanges 110, 112 fit within indentations 114, 116 formed on each side of card cage 82. Brackets 102, 104 are bolted to dual panel 118 and face plate 120 as shown in FIG. 8. The steel brackets 102, 104 can be mounted first and have enough flexibility to allow the card cage 82 to be pushed into place between them so that the slots snap over the cage ribs.

Referring to FIG. 9, two card cages are bolted to a dual panel 118, having face plates 120, 122. A support rod 124 is then connected between ends 126, 128 of adapter 118, as shown by dashed lines.

Referring to FIG. 10, the assembled adapter and card cages are bolted to two vertical rails 130, 132 of a wiring closet, as shown by dashed lines.

Referring to FIG. 11, as an alternative embodiment, card cage 82 is connected with an expanded panel 134, able to hold eight such card cages. Card cage 82 is bolted to panel 134 as described above, and as shown by dashed lines in FIG. 7.

Other embodiments are within the following claims.

We claim:

1. A retainer clip for holding a circuit board within a card cage, comprising:

an elongated generally rectangular base plate having fastener means for detachably gripping an edge of a circuit board;

a first pivotable clasp affixed at an end of said base plate for releasably connecting said retainer clip to said card cage to hold a circuit board gripped by said fastener in place within the card cage; and a second pivotable clasp affixed at an end of said base plate opposite to said end where said first pivotable clasp is affixed, said first pivotable clasp and said second pivotable clasp being manually operable simultaneously as a clasp pair by one hand and;

a) are each extending at right angles in a same direction from either end of said base plate, and b) each have finger grips extending therefrom such that by drawing said grips together said first pivotable clasp and said second pivotable clasp are each lifted to release said retainer clip from the card cage, and said base plate including:

a) a first region of reduced thickness near a junction of said base plate and said first pivotable clasp forming a first resilient hinge, and b) a second region of reduced thickness near a junction of said base plate and said second pivotable clasp forming a second resilient hinge.

2. The retainer clip of claim 1, wherein:

said first pivotable clasp includes a first clasp plate attached at its midpoint to said first resilient hinge, said first clasp plate including a first end having a pawl and a second end having a finger grip; and said second pivotable clasp includes a second clasp plate attached at its midpoint to said second resilient hinge, said second clasp plate including a first end having a pawl and a second end having a finger grip.

3. The retainer clip of claim 1, wherein said base plate has a first stop and a second stop, said first stop limiting pivoting of said first pivotable clasp and said second top limiting pivoting of said second pivotable clasp.

4. The retainer clip of claim 3, wherein:

said first stop includes a first vane rising perpendicularly from said base plate, said first vane located next to said first resilient hinge and spaced from and perpendicular to said first clasp plate; and said second stop includes a second vane rising perpendicularly form said base plate, said second vane located next to said second resilient hinge and spaced from and perpendicular to said second clasp plate.

5. The retainer clip of claim 4, wherein said fastener means includes a plurality of parallel tabs, and at least two of said parallel tabs capable of slipping over opposite sides of the circuit board.

6. The retainer clip of claim 5, wherein said parallel tabs have projections which fit into recesses formed in the circuit board.

7. The retainer clip of claim 6, wherein said parallel tabs include two outer tabs and one center tab, the two outer tabs having cylindrical bosses with bevelled leading edges and the center tab having at least one rounded boss.

8. A rectangular circuit board for a card cage, having a leading and a trailing edge and an identical series of electrically useless recesses formed along both the leading edge and the trailing edge for reversibly receiving a mating retainer clip for fastening said circuit board to said card cage.

9. The circuit board of claim 8, wherein said recesses detachably receive parallel tabs of said retainer clip.

10. The circuit board of claim 8, wherein said recesses are approximately in a straight line.

11. The circuit board of claim 8, wherein said recesses are through holes.

* * * * *